United States Patent [19]

Gaske

[11] Patent Number: 4,657,779

[45] Date of Patent: Apr. 14, 1987

[54] SHRINKAGE-RESISTANT ULTRAVIOLET-CURING COATINGS

[75] Inventor: Joseph E. Gaske, Mt. Prospect, Ill.

[73] Assignee: DeSoto, Inc., Des Plaines, Ill.

[21] Appl. No.: 841,216

[22] Filed: Mar. 19, 1986

[51] Int. Cl.$^4$ .............................................. B05D 3/06
[52] U.S. Cl. .................... 427/54.1; 427/44; 522/25; 522/31; 522/170
[58] Field of Search ............... 427/44, 54.1; 522/170, 522/25, 31

[56] References Cited

U.S. PATENT DOCUMENTS

| | | | |
|---|---|---|---|
| 4,156,035 | 5/1979 | Tsao et al. | 427/44 |
| 4,218,531 | 8/1980 | Carlson | 522/170 |
| 4,245,029 | 1/1981 | Crivello | 522/170 |
| 4,256,828 | 3/1981 | Smith | 522/170 |
| 4,303,696 | 12/1981 | Brack | 427/44 |
| 4,423,136 | 12/1983 | Crivello et al. | 522/170 |
| 4,576,850 | 3/1986 | Martens | 427/44 |
| 4,582,885 | 4/1986 | Barber | 427/44 |

FOREIGN PATENT DOCUMENTS 0021542  2/1984  Japan .................... 522/170

*Primary Examiner*—John H. Newsome

*Attorney, Agent, or Firm*—Dressler, Goldsmith, Shore, Sutker & Milnamow, Ltd.

[57] ABSTRACT

An ultraviolet-curable liquid coating composition which possesses minimal substrate deformational shrinkage on cure is disclosed in which (A) a cationically curable polyepoxide having a 1,2-epoxy equivalency of at least 1.3 is used in admixture with (B) an acrylate-functional compound which is either (1) a monoacrylate-functional compound carrying at least two primary hydroxy groups; or (2) an epoxy-functional monoacrylate in admixture with a compound carrying a plurality of primary hydroxyl groups. An acrylate-functional liquid (C), preferably a monoacrylate, is used to provide coating viscosity, and a catalyst component capable of initiating, on ultraviolet exposure, both the conventional free-radical polymerization of ethylenically unsaturated monomers, and the cationic polymerization of polyepoxides in the presence of a compound carrying the primary hydroxy group. This catalyst component usually comprises a radiation sensitive aromatic onium salt capable of releasing a Lewis acid when exposed to radiant energy, together with an effective amount of a ketonic free radical photoinitiator when the onium salt is ineffective to perform this function. This provides a two stage cure in which shrinkage is minimized to control curling and cupping of easily deformable coated substrates.

14 Claims, No Drawings

SHRINKAGE-RESISTANT ULTRAVIOLET-CURING COATINGS

DESCRIPTION

1. Technical Field

This invention relates to liquid ultraviolet-curable coating compositions which cure to a solid adherent film with minimum deformational shrinkage so as to minimize curling and cupping of easily deformed substrates.

2. Background Art

It is desirable to protect easily deformed substrates, such as polycarbonate discs of the type intended to be read using laser light, using ultraviolet-curing coatings. However, when the usual acrylate-based ultraviolet-curable coatings are used, the free-radical cure proceeds in a single stage to cause extensive shrinkage which deforms the substrate, e.g., it causes the polycarbonate disc to curl or cup. As a result, the usual acrylate-based ultraviolet-curable coatings are not useful on such easily deformable substrates. We know of nothing to suggest how the rapid cure of acrylate-based ultraviolet-curable coatings can be maintained without encountering the shrinkage which cannot be tolerated when the substrate is easily deformed.

Of interest to this invention is U.S. Pat. No. 4,158,035 issued to W. R. Grace and Co. in the names of Jung-Hsien Tsao and Arthur D. Ketley. This patent, issued on May 22, 1979, discloses radiation curable coatings comprising mixtures of epoxy resin and di- or polyacrylate or methacrylate monomers in combination with a catalyst system capable of initiating both free radical polymerization and cationic polymerization upon ultraviolet exposure. This is done with a combination of a carbonyl type photoinitiator and an aromatic onium salt which releases a Lewis acid on ultraviolet exposure. However, this patent does not consider the problem of shrinkage, it does not employ a polyhydric alcohol containing a plurality of primary hydroxy groups, and it relies upon polyacrylates for the free radical cure whereas monoacrylates are used herein.

DESCRIPTION OF INVENTION

In accordance with this invention, an ultraviolet-curable liquid coating composition comprises: (A) a cationically curable polyepoxide; (B) an acrylate-functional compound carrying at least one reactive group selected from: (1) a monoacrylate-functional compound carrying at least two primary hydroxy groups; and (2) an epoxy-functional monoacrylate in admixture with a compound carrying a plurality of primary hydroxyl groups; (C) an acrylate-functional liquid, preferably a monoacrylate, in an amount providing coating viscosity; and (D) a catalyst component capable of initiating, on ultraviolet exposure, both the conventional free-radical polymerization of ethylenically unsaturated monomers, and the cationic polymerization of polyepoxides in the presence of a compound carrying the primary hydroxy group. This catalyst component usually comprises a radiation sensitive aromatic onium salt capable of releasing a Lewis acid when exposed to radiant energy, preferably a triaryl sulfonium or iodinium salt. The ratio of epoxy groups provided by component (A) to primary hydroxy groups provided by component (B) should be in the range of from 0.5:1 to 6:1, preferably from 1.5:1 to 4:1.

When the liquid coatings of the above composition are exposed to ultraviolet light, the coating cures in two stages. In the first stage, the acrylate-functional compound polymerizes rapidly by free-radical mechanism, but the shrinkage tendency of the free-radical cure is relieved because the coating has not yet solidified because the cationically curable polyepoxide is present as an unreacted diluent. In the second stage, the cationically curable polyepoxide cures slowly with the primary hydroxy groups which are present to provide the desired fully solidified protective coating. However, the cationic cure does not exhibit the undesirable shrinkage which characterizes the free radical cure.

On the other hand, the coatings of this invention retain much of the rapid curing character of the acrylate coating systems, and rapid ultraviolet exposures can be used.

The polyepoxides which are cationically curable and used in this invention as component (A) constitute a known class of materials. Those based on hydrogenated bisphenol, such as Eponex DRH 1511 and DRH 1510, are useful herein, but cycloaliphatic liquid epoxy resins, such as Bakelite ERL 4221 and ERL 4299, are also useful. Hydantoin-based polyepoxides are also useful and available from Ciba-Geigy. These may be used alone, or in combination with glycidyl ethers of a bisphenol, such as the Shell products Epon 828 and Epon 1001, or the Ciba-Geigy product Araldite 6010. These commercial products are all of known composition, and can be described as resinous polyepoxides having a 1,2-epoxy equivalency of at least 1.3. Polyepoxides based on phenolic novalac resins and epoxidized polybutadienes, are also useful, and the pure "electronic grades" of phenolic novalacs are presently preferred. These "electronic grades" contain very low levels of hydrolyzable chlorine. The epoxidized novalacs may be used alone or in admixture with the hydrogenated bisphenol-based polyepoxides or the cycloaliphatic polyepoxides. Even monoepoxides may be present, such as Cardura E from Shell Chemical Company which is a glycidyl ester of neodecanoic acid.

Component (B) in this invention can be selected from two categories, as previously noted. In the first category we have monoacrylates containing a plurality of primary hydroxy groups. These are illustrated by acrylate esters and ethers of polyhydric alcohols containing three or more hydroxy groups. Thus, one may use an acrylate ester formed by reacting one molar proportion of acrylic acid or 2-hydroxyethyl acrylate with one molar proportion of trimethylol propane or pentaerythritol. The ether of one mole of 2-ethoxy acrylate with one mole of trimethylol propane will be used as illustrative.

In the second category we have epoxy monoacrylates, such as glycidyl acrylate or the monoacrylate of a low molecular weight diglycidyl ether of a bisphenol, such as the commercial product Epon 828 sold by Shell Chemical Company. These are used in combination with a polyhydric alcohol containing at least two hydroxy groups, such as ethylene glycol, diethylene glycol, 1,4-butane diol, 1,6-hexane diol, trimethylol propane, and the like.

The coating compositions of this invention are preferably of relatively low viscosity to enable spin coating to be used, for this is a particularly effective procedure for coating the polycarbonate discs under consideration. Even for general coating application, an acrylate liquid should be added to adjust viscosity. These materials are entirely conventional, and are illustrated by low viscosity acrylate liquids such as ethoxy acrylate, ethoxyethoxyethyl acrylate, butyl acrylate, phenoxyethyl acrylate, and the like.

The compositions of this invention are catalyzed by a catalyst component capable of initiating, on ultraviolet exposure, both the conventional free-radical polymerization of ethylenically unsaturated monomers, and the cationic polymerization of polyepoxides in the presence of a compound carrying the primary hydroxy group.

Photoinitiators useful for the ultraviolet-initiated cationic cure of appropriate polyepoxides are known. These are fully disclosed in U.S. Pat. No. 4,156,035, the disclosure of which is incorporated by reference. This patent indicates that any radiation sensitive aromatic onium salt of a group VIa element capable of releasing a Lewis acid when exposed to radiant energy may be used, triphenyl sulfonium fluroborate, triphenyl sulfonium hexafluorophosphate and triphenyl sulfonium hexafluoroantimonate being mentioned to illustrate the character of the known onium salts which may be used. This patent uses these onium salts in combination with what it describes as carbonyl type photoinitiators, i.e., the aldehyde and ketone carbonyl compounds having at least one aromatic nucleus attached directly to the carbonyl group, such as benzophenone, acetophenone, or many others listed in the patent. Diaryliodonium salts, such as the 3M product FC 509, are also contemplated, and these are normally used in combination with a ketonic photosensitizer, especially benzophenone. Other photosensitizers are illustrated by chlorothioxanthone, isopropylthioxanthone, thioxanthone, xanthone, and the like. Benzophenone is preferred because of its greater solubility and lower cost.

The onium salts under consideration are more fully disclosed in U.S. Pat. Nos. 4,069,054, 4,069,055, 4,069,054 and 4,423,136.

Since iodonium salts normally require ketonic photosensitizers, it is preferred to employ triaryl sulfonium salts, such as the 3M product FC 508 and UVE-1014 from General Electric Co. These sulfonium salts do not require ketonic photosensitizer. The General Electric product is especially preferred and is described as a triphenyl sulfonium antimony hexafluoride which is available in a 50% solution in propylene carbonate.

EXAMPLE 1

| Component | Weight Percent |
| --- | --- |
| Epoxy novolac (2.2 epoxy groups per molecule) [see Note 1] | 44 |
| Ethoxyethoxyethyl acrylate (nonfunctional acrylate diluent) | 32 |
| Trimethylol propane monoethoxy acrylate | 20 |
| Triphenyl sulfonium antimony hexafluoride (50% solution in propylene carbonate) [see Note 2] | 4 |

Note 1: Ciba Geigy (Ardsley, NY) product DEN 431 may be used.
Note 2: General Electric Company (Schenectady, NY) product UVE-1014 may be used. This is a dual acting catalyst which simultaneously provokes free-radical polymerization and cationic polymerization upon ultraviolet exposure.

In this example, 0.25 equivalents of oxirane functionality are reacted with 0.125 equivalents of primary hydroxy in the trimethylol propane monoethoxy acrylate.

EXAMPLE 2

| Component | Weight Percent |
| --- | --- |
| Epoxy novolac (2.2 epoxy groups per molecule) [see Note 1] | 44 |
| Ethoxyethoxyethyl acrylate (nonfunctional acrylate diluent) | 32 |
| Diglycidyl ether of bisphenol A (molecular weight 390) monoacrylate [see Note 3] | 10 |
| Ethylene glycol | 10 |
| Triphenyl sulfonium antimony hexafluoride (50% solution in propylene carbonate) [see Note 2] | 4 |

Note 1: Ciba Geigy (Ardsley, NY) product DEN 431 may be used.
Note 2: General Electric Company (Schenectady, NY) product UVE-1014 may be used. This is a dual acting catalyst which simultaneously provokes free-radical polymerization and cationic polymerization upon ultraviolet exposure.
Note 3: Shell Chemical Company product Epon 828 can be used after reaction with one molar proportion of acrylic acid.

EXAMPLE 3

| Component | Weight Percent |
| --- | --- |
| Cycloaliphatic polyepoxide [see Note 4] | 54.5 |
| Dicaprolactone acrylate (nonfunctional acrylate diluent) | 13.6 |
| Trimethylol propane monoethoxy acrylate | 27.4 |
| Triphenyl sulfonium antimony hexafluoride (50% solution in propylene carbonate) [see Note 2] | 4.5 |

Note 2: General Electric Company (Schenectady, NY) product UVE-1014 may be used. This is a dual acting catalyst which simultaneously provokes free-radical polymerization and cationic polymerization upon ultraviolet exposure.
Note 4: Union Carbide Corporation product UVR 6110 may be used.

These coatings are applied to the metallized surface of a metallized polycarbonate disc. The disc with the coating material thereon is spun to distribute the coating over the surface of the disc, and the wet-coated surface is then exposed to ultraviolet light to cure the same. The shrinkage encountered when the usual acrylate coatings are employed is avoided by the various compositions which have been illustrated herein.

The disc coated in this example has a metallized surface, but this is not essential.

What is claimed is:

1. An ultraviolet-curable liquid coating composition which possesses minimal deformational shrinkage on cure comprising: (A) a cationically curable polyepoxide having a 1,2-epoxy equivalency of at least 1.3; (B) an acrylate-functional compound carrying at least one reactive group selected from: (1) a monoacrylate-functional compound carrying at least two primary hydroxy groups; and (2) an epoxy-functional monoacrylate in admixture with a compound carrying a plurality of primary hydroxyl groups; (C) an acrylate-functional liquid, preferably a monoacrylate, in an amount providing coating viscosity; and (D) a catalyst component capable of initiating, on ultraviolet exposure, both the conventional free-radical polymerization of ethylenically unsaturated monomers, and the cationic polymerization of polyepoxides in the presence of a compound carrying the primary hydroxy group, the ratio of epoxy groups provided by component (A) to primary hydroxy groups provided by component (B) being in the range of from 0.5:1 to 6:1.

2. An ultraviolet-curable liquid coating composition as recited in claim 1 in which said cationically curable polyepoxide is an epoxy novalac.

3. An ultraviolet-curable liquid coating composition as recited in claim 1 in which said cationically curable polyepoxide is a cycloaliphatic polyepoxide.

4. An ultraviolet-curable liquid coating composition as recited in claim 1 in which said component (B) is a monoacrylate derivative of trimethylol propane.

5. An ultraviolet-curable liquid coating composition as recited in claim 4 in which said monoacrylate derivative is trimethylol propane monoethoxy acrylate.

6. An ultraviolet-curable liquid coating composition as recited in claim 1 in which said component (B) is a mixture of an epoxy functional monoacrylate and a polyhydric alcohol carrying at least two primary hydroxy groups.

7. An ultraviolet-curable liquid coating composition as recited in claim 6 in which said polyhydric alcohol is ethylene glycol.

8. An ultraviolet-curable liquid coating composition as recited in claim 1 in which said ratio of epoxy groups provided by component (A) to primary hydroxy groups provided by component (B) is in the range of from 1.5:1 to 4:1.

9. An ultraviolet-curable liquid coating composition which possesses minimal deformational shrinkage on cure comprising: (A) a cationically curable polyepoxide having a 1,2-epoxy equivalency of at least 1.3; (B) an acrylate-functional compound carrying at least one reactive group selected from: (1) a monoacrylate-functional compound carrying at least two primary hydroxy groups; and (2) an epoxy-functional monoacrylate in admixture with a compound carrying a plurality of primary hydroxyl groups; (C) an acrylate-functional liquid, preferably a monoacrylate, in an amount providing coating viscosity; and (D) a radiation sensitive aromatic onium salt capable of releasing a Lewis acid when exposed to radiant energy, and an effective amount of a ketonic free radical photoinitiator when said onium salt is ineffective to also perform this function, the ratio of epoxy groups provided by component (A) to primary hydroxy groups provided by component (B) being in the range of from 0.5:1 to 6:1.

10. An ultraviolet-curable liquid coating composition as recited in claim 1 in which said onium salt is a triaryl sulfonium or iodinium salt.

11. An ultraviolet-curable liquid coating composition as recited in claim 10 in which said onium salt is a triphenyl sulfonium antimony hexafluoride.

12. A method of coating an easily deformable substrate with a liquid ultraviolet curable coating composition which cures to a solid adherent film with minimum deformational shrinkage comprising applying the liquid coating composition of claim 1 and exposing the applied coating to ultraviolet light.

13. A method as recited in claim 11 in which said deformable substrate is a polycarbonate disc.

14. A method as recited in claim 12 in which said disc is spun to spread said liquid coating on said disc.

* * * * *